United States Patent
Waite et al.

(10) Patent No.: US 10,600,675 B2
(45) Date of Patent: Mar. 24, 2020

(54) TECHNIQUES AND STRUCTURE FOR FORMING THIN SILICON-ON-INSULATOR MATERIALS

(71) Applicant: Varian Semiconductor Equipment Associates, Inc., Gloucester, MA (US)

(72) Inventors: Andrew M. Waite, Beverly, MA (US); Morgan D. Evans, Manchester, MA (US); John Hautala, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 18 days.

(21) Appl. No.: 15/728,000

(22) Filed: Oct. 9, 2017

(65) Prior Publication Data
US 2019/0027396 A1  Jan. 24, 2019

Related U.S. Application Data

(63) Continuation-in-part of application No. 15/657,959, filed on Jul. 24, 2017, now abandoned.

(51) Int. Cl.
| | |
|---|---|
| H01L 21/762 | (2006.01) |
| H01L 21/311 | (2006.01) |
| H01L 21/02 | (2006.01) |
| H01L 27/12 | (2006.01) |
| H01J 37/305 | (2006.01) |
| H01L 21/3065 | (2006.01) |

(52) U.S. Cl.
CPC ...... *H01L 21/7624* (2013.01); *H01J 37/3053* (2013.01); *H01L 21/02164* (2013.01); *H01L 21/02238* (2013.01); *H01L 21/02252* (2013.01); *H01L 21/02255* (2013.01); *H01L 21/3065* (2013.01); *H01L 21/31116* (2013.01); *H01L 27/1203* (2013.01); *H01J 2237/20214* (2013.01); *H01J 2237/20228* (2013.01)

(58) Field of Classification Search
None
See application file for complete search history.

(56) References Cited

U.S. PATENT DOCUMENTS

| | | | |
|---|---|---|---|
| 2007/0087514 A1* | 4/2007 | Hamamoto | ....... H01L 21/76243 438/406 |
| 2016/0002784 A1* | 1/2016 | Omstead | ........... C23C 16/45536 427/523 |

OTHER PUBLICATIONS

Banna, et al., "Pulsed High-Density Plasmas for Advanced Dry Etching Processes," J. Vac.Sci. Technol. A 30(4), Jul./Aug. 2012 040801-1/040801-29.

(Continued)

*Primary Examiner* — Moazzam Hossain
*Assistant Examiner* — Stanetta D Isaac

(57) ABSTRACT

A method may include providing a silicon-on-insulator (SOI) substrate, the SOI substrate comprising an insulator layer and a silicon layer. The silicon layer may be disposed on the insulator layer, where the silicon layer comprises a first silicon thickness variation. The method may include forming an oxide layer on the silicon layer, where the oxide layer has a uniform thickness. The method may include selectively etching the oxide layer on the silicon layer, wherein the oxide layer comprises a first non-uniform oxide thickness. After thermal processing of the SOI substrate in an oxygen ambient, the non-uniform oxide thickness may be configured to generate a second silicon thickness variation in the silicon layer, less than the first silicon thickness variation.

19 Claims, 6 Drawing Sheets

(56) References Cited

OTHER PUBLICATIONS

Banna, et al., "Inductively Coupled Pulsed Plasmas in the Presence of Synchronous Pulsed Substrate Bias for Robust Reliable, and Fine Conductor Etching," IEEE Transactions of Plasma Science, vol. 37, No. 9, Sep. 2009, 1730-1746.

* cited by examiner

TECHNIQUES AND STRUCTURE FOR FORMING THIN SILICON-ON-INSULATOR MATERIALS

RELATED APPLICATION

This application is a continuation-in-part of and claims priority to U.S. patent application Ser. No. 15/657,959, filed Jul. 24, 2017, entitled TECHNIQUES AND STRUCTURE FOR FORMING THIN SILICON-ON-INSULATOR MATERIALS, and incorporated herein in its entirety.

FIELD

The present embodiments relate to semiconductor substrates, and more particularly, to processing for thin silicon-on-insulator devices.

BACKGROUND

Thin silicon-on-insulator substrates are useful for forming advanced semiconductor devices. Such substrates are sometimes referred to as extremely thin silicon-on-insulator (ETSOI) substrates. As an example, fully depleted transistor devices may be constructed using ETSOI substrates. This advantage may be particularly useful for technology nodes of 28 nm or below. To form an ETSOI device, a thin layer of silicon is formed on an insulator layer, such as a buried oxide. The threshold voltage of a transistor formed on ETSOI substrate (ETSOI transistor) depends upon the thickness of the thin silicon layer. Accordingly, the control of silicon layer thickness of the thin silicon layer may be paramount for forming robust device technology, such as complementary metal oxide semiconductor (CMOS) technology using ETSOI substrates. With respect to these and other considerations, the present disclosure is provided.

BRIEF SUMMARY

In one embodiment, a method may include providing a silicon-on-insulator (SOI) substrate, the SOI substrate comprising an insulator layer and a silicon layer. The silicon layer may be disposed on the insulator layer, where the silicon layer comprises a first silicon thickness variation. The method may include forming an oxide layer on the silicon layer, where the oxide layer has a uniform thickness. The method may include selectively etching the oxide layer on the silicon layer, wherein the oxide layer comprises a first non-uniform oxide thickness. After thermal processing of the SOI substrate in an oxygen ambient, the non-uniform oxide thickness may be configured to generate a second silicon thickness variation in the silicon layer, less than the first silicon thickness variation.

In another embodiment, a method may include providing a silicon-on-insulator (SOI) substrate, where the SOI substrate comprises an insulator layer and a silicon layer, wherein the silicon layer is disposed on the insulator layer. The silicon layer may have a first silicon thickness variation. The method may also include selectively forming an oxide layer in the silicon layer, wherein the oxide layer comprises a non-uniform oxide thickness, wherein after the selectively forming the oxide layer the silicon layer exhibits a second silicon thickness variation, less than the first silicon thickness variation.

In a further embodiment, a semiconductor substrate may include a silicon base, an insulator layer, disposed on the silicon base, and a silicon layer, disposed on the insulator layer. The silicon layer may have a uniform thickness, the uniform thickness being 20 nm or less. The semiconductor substrate may further include an oxide layer, disposed on the silicon layer, the oxide layer having a non-uniform thickness, wherein a maximum thickness of the oxide layer is 30 nm or less.

DETAILED DESCRIPTION

Figure 1A:
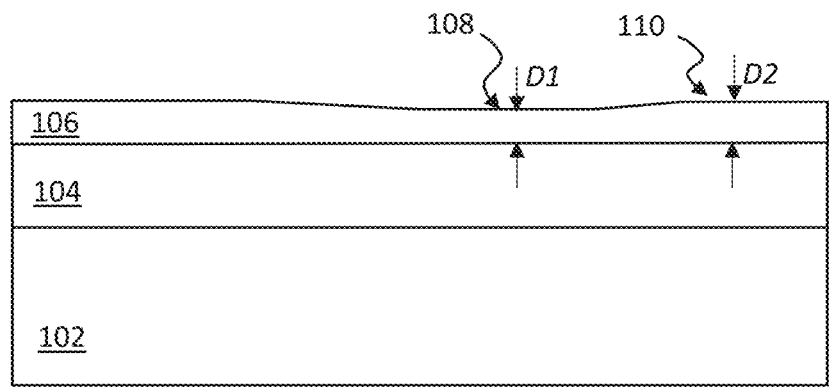
FIGS. 1A-1E depict one example of forming of an SOI substrate according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques and substrate structures to form thin silicon-on-insulator (SOI) substrates and devices. Various embodiments are particularly useful for implementation where the final thickness of the silicon layer in the SOI substrate is to be 30 nm or less, and in particular, 20 nm or less. In these substrates, variations in silicon thickness across a substrate of 1 nm, 2 nm, or 5 nm, for example, may have a significant impact on device uniformity. In particular, ETSOI substrates are often designed to have silicon layer thickness on the order of 5 nm to 10 nm. The present embodiments provide various approaches to address the challenge of providing adequate thickness uniformity for such thin silicon layers in a manner that preserves the integrity of the thin silicon layer, to be used for device fabrication.

In various embodiments, starting with a given SOI substrate, a series of operations may be performed to reduce silicon thickness variation in the SOI substrate. For example, a given SOI substrate used as a starting material may be a commercially available ETSOI wafer. In various embodiments, before an oxide layer is formed, as detailed below, the silicon layer comprises a maximum thickness of 30 nm or less.

FIGS. 1A-1E depict one example of forming of an SOI substrate according to embodiments of the disclosure. In FIG. 1A there is shown a substrate 100, representing, for example, an SOI substrate, such as an ETSOI substrate. The substrate 100 includes a silicon base 102, an insulator layer 104, such as a buried oxide layer, and a silicon layer 106. In various embodiments, the nominal or average thickness of the silicon layer 106 may be less than 30 nm, such as 20 nm, 10 nm, or 5 nm. The embodiments are not limited in this context. The silicon layer 106 may be characterized by a first thickness variation. This first thickness variation may be represented and measured by various known techniques. The thickness variation in particular may correspond to variations in silicon layer thickness over macroscopic distances such as centimeters or millimeters. As an example, an SOI substrate may exhibit a continuous change in silicon layer thickness from one edge of the SOI substrate to another edge of the SOI substrate, where the thickness is greater near one edge than the other. As another example, silicon layer thickness may be relatively less in a center of the substrate as opposed to in regions toward the edge of the substrate. Other possible non-uniform thickness patterns are possible.

In some embodiments, a silicon thickness profile may be received or may be experimentally determined for a given substrate, such as substrate 100. The silicon thickness profile may include a plurality of data sets, where a given data set includes silicon thickness and a substrate position corresponding to that silicon thickness. The silicon thickness profile may be determined by known techniques such as ellipsometry, reflectometry, or other appropriate technique. The silicon thickness profile may be determined from a two dimensional matrix of substrate positions within the plane of the substrate 100 (X-Y plane in the Cartesian coordinate system shown). In different embodiments, the spacing between adjacent positions in the two-dimensional matrix may be, for example, several millimeters, one centimeter, and so forth. The silicon thickness profile for the substrate 100 may serve as the basis for further operations, as detailed below.

For purposes of illustration and clarity, in the cross-sectional view of the substrate 100, two positions are shown, a first position 108, and second position 110. The thickness of the silicon layer 106 at the first position 108 is represented by D1, while the thickness of the silicon layer 106 at the second position 110 is represented by D2. In accordance with various embodiments, the first position 108 and the second position 110 may represent two positions of a plurality of positions in an X-Y matrix of a silicon thickness profile, as described above. Of course, other thicknesses may be associated with other positions. Additionally, the cross-sectional view shown in FIG. 1A and other figures is not necessarily drawn to scale. In particular, the thickness of the insulator layer 104 and silicon layer 106 may be on the order of nanometers to tens of nanometers along the Z-axis, while the separation between first position 108 and second position 110 may be on the order of millimeters or centimeters.

As suggested in FIG. 1A, the thickness of the silicon layer 106 in the region of the first position 108 is less than the thickness of the silicon layer 106 in the region of the second position 110. In one example D1 may represent a minimum thickness of the silicon layer 106 and D2 may represent a maximum thickness of the silicon layer 106, while the initial or first silicon thickness variation may be represented by the difference between D2 and D1. As discussed with respect to FIGS. 1B to 1E, this thickness variation may be reduced using a novel combination of operations.

Figure 1B:
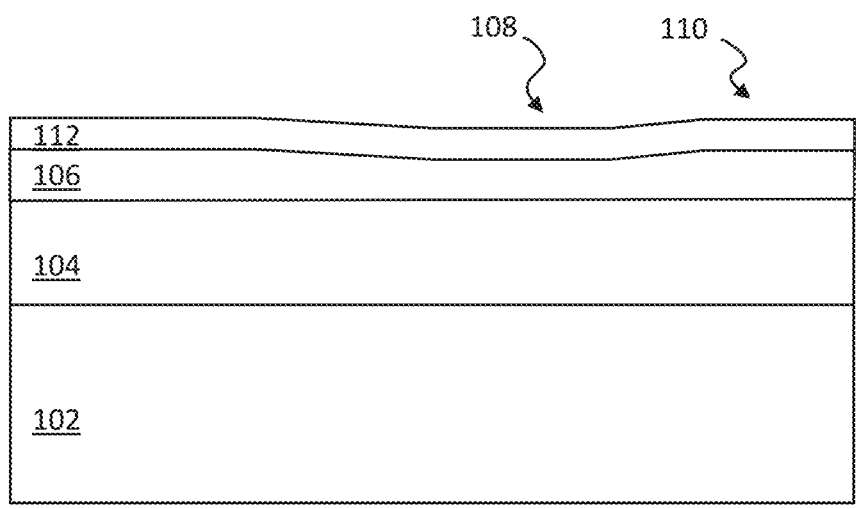

Turning now to FIG. 1B, there is shown the result of a subsequent operation wherein an oxide layer 112 is formed on the silicon layer 106. The oxide layer 112 may be formed by known deposition techniques, such as chemical vapor deposition, physical vapor deposition, atomic layer deposition, of other suitable technique. As an alternative, the oxide layer 112 may be formed by oxidizing a top portion of the silicon layer 106. In any of these cases, the oxide layer 112 may be formed having a uniform thickness. Moreover, after formation of the oxide layer 112, whether by deposition onto the silicon layer 106, or by oxidizing the top of the silicon layer 106, the silicon layer 106 continues to exhibit a thickness variation, which variation may be the same as before the formation of the oxide layer 112.

Figure 1C:
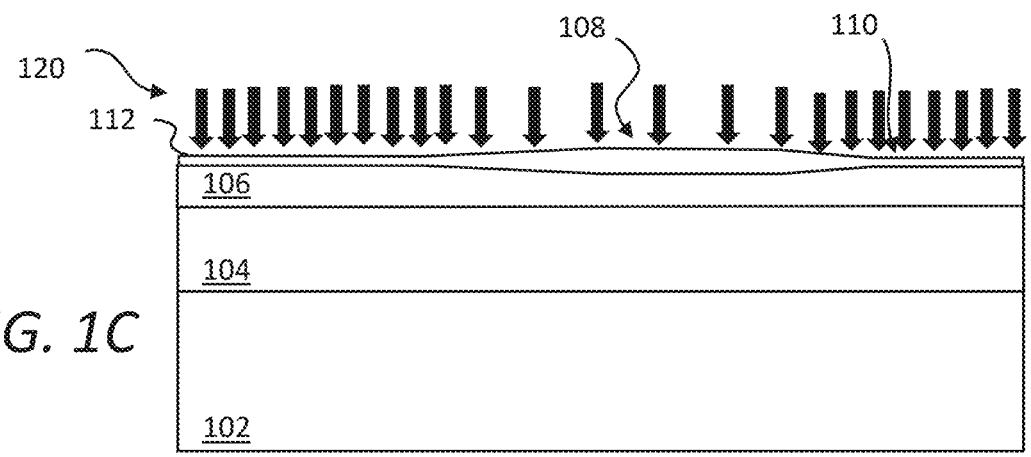

Turning now to FIG. 1C, a subsequent operation of selectively etching the oxide layer 112 is performed, resulting in the oxide layer 112 having a non-uniform oxide thickness. As suggested schematically in FIG. 1C, the selectively etching of the oxide layer 112 entails etching the oxide layer 112 to a lesser or greater degree as different positions along the surface of the substrate 100, meaning at different positions within the X-Y plane. The intensity of the etching provided by the etchant species 120 is represented by the dark arrows, with more intense etching represented by more closely spaced arrows. In various embodiments, the etchant species in a given etch treatment may be an ion beam, as discussed below with respect to FIG. 3A. By providing an etch treatment involving selective etching across the substrate 100, different thickness of oxide may be removed at different positions. For example, a first thickness of oxide may be removed at the first position 108, while a second thickness of oxide is removed at the second position 110. In particular, for a given position on the substrate 100, the amount of removal of oxide is tailored to the thickness of the silicon layer 106 at the given position. In general, where the silicon thickness of silicon layer is greater, the amount of oxide removal of the oxide layer 112 is greater. Thus, in the example of FIG. 1B, the second thickness of oxide that is removed from the second position 110 is greater than the first thickness of oxide that is removed at the first position 108. In some examples, no oxide may be removed at a position where the silicon thickness is at a minimum for silicon layer 106.

As a result of the selective etching, and as additionally shown in FIG. 1C, the thickness of the oxide layer 112 is greater at the first position 108 as compared to the thickness of oxide layer 112 at second position 110. This variation in thickness of the oxide layer 112 facilitates selective oxidation of underlying silicon, silicon layer 106.

Figure 1D:
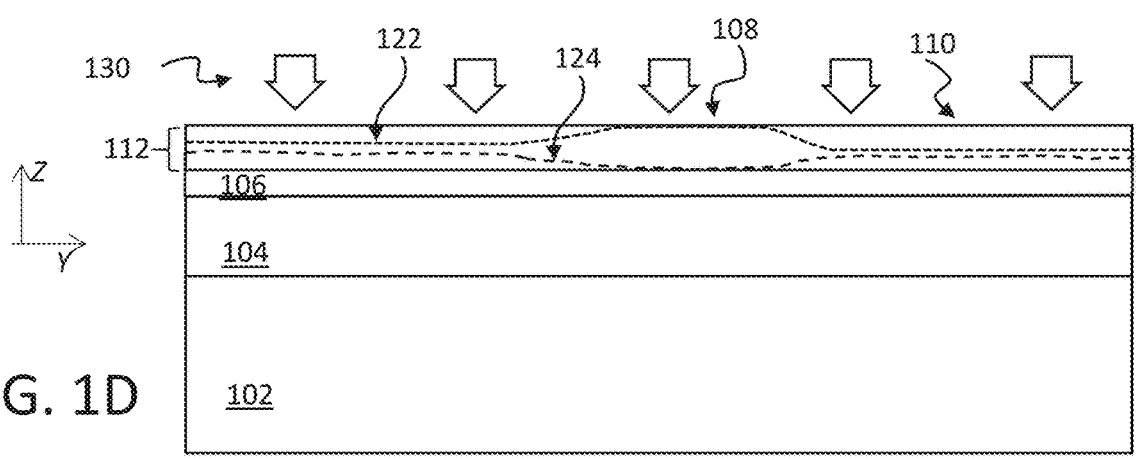

Turning now to FIG. 1D, there is shown a subsequent operation where the substrate 100 is subject to thermal processing 130 in an oxygen ambient. The thermal processing 130 in the oxygen ambient is represented by the open arrows, where the open arrows may represent a combination of temperature and oxygen species. The thermal processing 130 may take place in any suitable apparatus, such as a known furnace for thermal oxidation in a dry or wet oxygen ambient, a rapid thermal annealing tool, or other suitable operation. The thermal processing 130 may be performed at a known temperature range, gas pressure, and duration to achieve a desired amount of oxidation of the silicon layer 106. In some examples, the thermal processing 130 may involve rapid thermal processing by heating a substrate to between 950° C. and 1100° C. for a duration of 10 s to 30 s. In another example, thermal processing 130 may entail dry thermal oxidation in a furnace tube at a temperature of between 800° C. and 900° C. for 10 minutes to 60 minutes. In a further example, thermal processing 130 may entail wet oxidation at between 700° C. and 800° C. for 10 minutes to 60 minutes.

FIG. 1D further shows the original surface 122 of the silicon layer 106. As a result of the thermal processing 130 in oxygen ambient, oxygen may diffuse into and through the oxide layer 112, and may oxidize and consume a portion of the silicon layer 106. Because the thickness of the oxide layer 112 before the thermal processing 130, as represented by the oxide surface 124, varies as a function of position, the amount of oxygen diffusing into the silicon layer 106 also varies as a function of position. The regions where greater oxygen diffusion takes place result in greater consumption of silicon in the silicon layer 106. Thus, more oxygen diffusion takes place and more silicon is consumed at the second position 110, where the initial oxide layer thickness is less, as compared to first position 108, where the initial oxide layer thickness is greater. Notably, as discussed above, the regions where the thickness of oxide layer 112 is relatively less after the selective etching correspond to regions where the underlying silicon in silicon layer 106 is relatively greater. Accordingly, during the thermal processing 130 in oxygen ambient shown in FIG. 1D, greater silicon consumption by the oxidation process takes place in regions where the silicon thickness is greater. By matching greater silicon consumption to greater initial silicon thickness, the operation of FIG. 1D acts to reduce the variation in silicon thickness of silicon layer 106 across substrate 100. This situation is shown schematically in FIG. 1D, where the silicon layer now has a second silicon thickness variation that is less than the first silicon thickness variation shown in FIG. 1A. Because thermal oxidation is an exceedingly well understood and well controlled process, the degree of control of silicon consumption in the operation of FIG. 1D may be on the order of less than one nanometer.

Figure 1E:
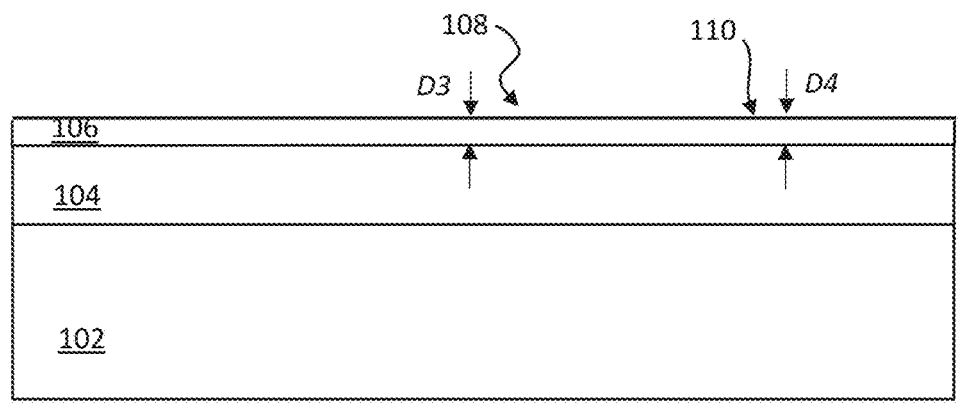

In FIG. 1E there is shown the results after the removal of the oxide layer 112. The substrate 100 now exhibits a silicon layer 106 having a reduced thickness variation as compare to the initial state, shown in FIG. 1A.

As detailed above, the use of an oxide layer 112 of non-uniform oxide thickness may be used as a screen for selectively oxidizing by thermal oxidation of the silicon layer 106, to reduce silicon thickness variation. In order to accomplish the selective oxidation of the silicon layer 106, in the operation of FIG. 1B, the oxide layer 112 may be provided with an initial oxide thickness that may be adjusted to compensate for the first silicon thickness variation. Said differently, depending upon the value of the first silicon thickness variation (for example, D2-D1), the oxide layer 112 is provided with an initial uniform oxide thickness adequate so adequate thickness of oxide layer 112 remains after selective etching in regions where thermal oxidation is to be minimized. Thus, if an SOI substrate shows an initial thickness of a silicon layer varying from 10 nm to 15 nm in thickness, the thickness of the uniform oxide layer formed on the silicon layer may be set to sufficient thickness so that portions above areas of thin silicon (10 nm) are sufficient to screen out most or all thermal oxidation from taking place.

By way of further explanation, the oxidation of a silicon surface may be brought about by the diffusion of oxidant species through the material that is already oxidized to the surface of the silicon. In this location, these oxidant species react with the silicon substrate to form fresh oxide and thicken the oxide film. The supply of these oxidant species, and therefore the rate of oxidizing of the silicon surface, is dependent upon the thickness of the overlying oxide, such that the silicon surface under a thick oxide will oxidize at a slower rate than a silicon surface under a thin oxide—with a corresponding difference in the amount of silicon substrate consumed. This effect may accordingly be exploited to modulate the amount of silicon under a modified initial oxide layer that is consumed by the oxidation process, by modulating the thickness of that oxide. As a result, the thickness uniformity of the underlying thin silicon layer may be improved.

Figure 2A:
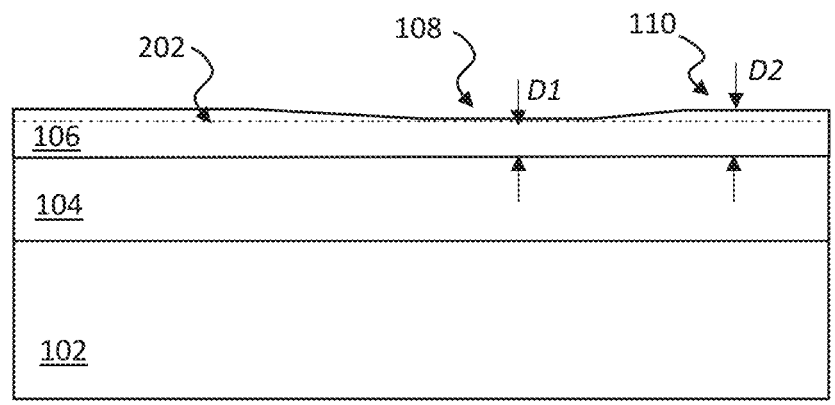
FIGS. 2A-2C depict another example of forming of an SOI substrate according to further embodiments of the disclosure.
Figure 2B:
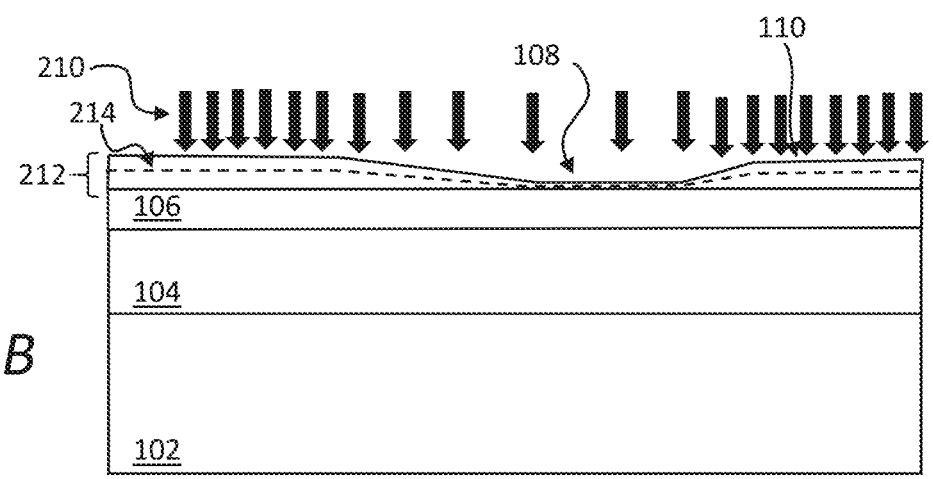
Figure 2C:
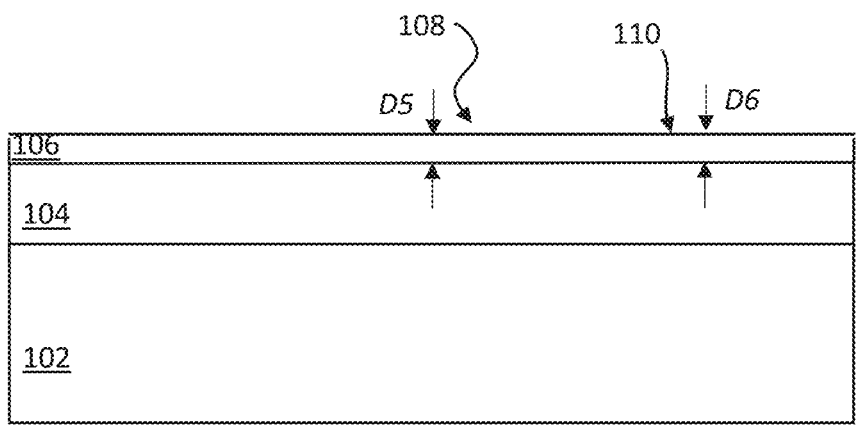

FIGS. 2A-2C depict another example of forming of an SOI substrate according to further embodiments of the disclosure. In FIG. 2A the substrate 100 is shown, generally in the same state as depicted in FIG. 1A. A target surface 202 is also shown, where the target surface 202 represents the surface of the silicon layer 106 to be formed after a selective treatment, as described with respect to FIG. 2B and FIG. 2C.

Turning now to FIG. 2B there is shown an operation of selectively forming an oxide layer 212 on the silicon layer 106, where the oxide layer 212 has a non-uniform thickness. In this embodiment, by virtue of the formation of the oxide layer 212, portions of the silicon layer 106, as represented in FIG. 2A, are selectively oxidized with respect to other portions. The intensity of an oxidizing treatment 210 is represented by the density of dark arrows. Analogous to the selective etching of a uniform oxide layer shown in FIG. 1C, followed by selective oxidation of FIG. 1D, the selective formation of the oxide layer 212 is tailored so that more silicon is consumed in regions where the initial thickness of silicon layer 106 is greater. In the operation of FIG. 2B, no silicon species are provided in selective formation of the oxide layer 212, meaning that the oxide layer 212 is formed entirely by consumption of silicon, in conjunction with an oxidizing species. Thus, the selective formation of oxide layer 212 moves the interface of the original surface of silicon layer 106, shown as surface 214, both upwardly and downwardly. In so doing, by selectively forming a greater amount of oxide layer 212 at second position 110, as opposed to first position 108, a greater amount of silicon is consumed near the second position 110, as opposed to the first position 108. This selective consumption has the effect of reducing the silicon thickness variation in the silicon layer 106. In summary, after the processing depicted in FIG. 2B, the substrate 100 has the structure where the silicon layer 106 may have a uniform silicon thickness, while the oxide layer 212, disposed over the silicon layer 106, has a non-uniform thickness. At this stage, the substrate 100 may be stored for future at the time devices are to be fabricated or may be processed as described in FIG. 2C.

Turning now to FIG. 2C, there is shown the substrate 100 after removal of the oxide layer 212. Again, the silicon layer 106 exhibits a second silicon thickness variation as represented by the difference between D5 and D6 at first position 108 and second position 110, respectively, where the second silicon thickness variation is less than the first silicon thickness variation in FIG. 2A.

Figure 3A:
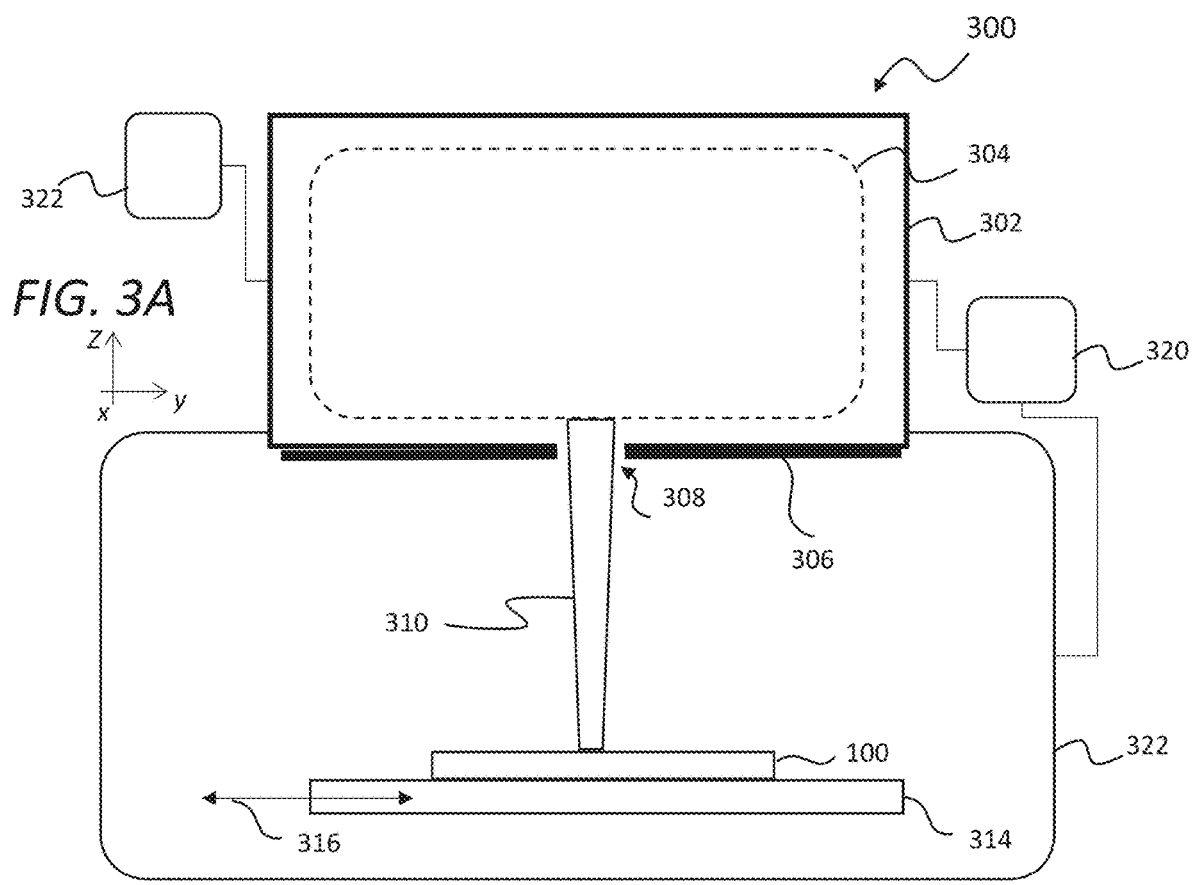
FIG. 3A illustrates an exemplary processing apparatus according to embodiments of the disclosure.

In accordance with various embodiments, the selective operations for selectively removing portions of a silicon layer in an SOI substrate may be conveniently performed using a processing apparatus 300, shown in FIG. 3A.

In FIG. 3A there is shown a substrate 100, such as an SOI substrate, where a substrate plane of the substrate 100 is represented by the X-Y plane of the Cartesian coordinate system shown, while a perpendicular to the plane of the substrate 100 lies along the Z-axis (Z-direction). In accordance with various embodiments, variations in silicon layer thickness of the substrate 100 at different X-Y locations of the substrate 100, may be compensated for by selectively processing the substrate 100 using processing apparatus 300.

As further shown in FIG. 3A the processing apparatus 300 is depicted in schematic form. The processing apparatus 300 represents a processing apparatus for non-uniformly processing the substrate 100 as a function of X-Y position. The processing apparatus 300 may be a plasma based processing system having a plasma chamber 302 for generating a plasma 304 therein by any convenient method as known in the art. An extraction plate 306 may be provided as shown, having an extraction aperture 308, where a selective area processing (SAP) operation may be implemented using a processing beam 310 to non-uniformly process the substrate 100 as a function of X-Y location.

During a SAP operation, the processing beam 310, which processing beam 310 may represent etching ions or oxidizing ions in different implementations, is extracted through the extraction aperture 308 as shown. The processing beam 310 may be extracted when a voltage difference is applied using bias supply 320 between the plasma chamber 302 and substrate 100 as in known systems. The bias supply 320 may be coupled to a process chamber 322, for example, where the process chamber 322 and substrate 100 are held at the same potential. In various embodiments, the processing beam 310 may be extracted as a continuous beam or as a pulsed ion beam as in known systems. For example, the bias supply 320 may be configured to supply a voltage difference between plasma chamber 302 and process chamber 322, as a pulsed DC voltage, where the voltage, pulse frequency, and duty cycle of the pulsed voltage may be independently adjusted from one another.

By scanning a substrate stage 314 including substrate 100 with respect to the extraction aperture, and thus with respect to the processing beam 310 along the scan direction 316, the processing beam 310 may etch a oxide layer (see oxide layer 112) or oxidize the silicon layer (see silicon layer 10) in a non-uniform manner. This non-uniform processing may account for initial differences thickness of the silicon layer in different regions (X-Y locations) of substrate 100, as discussed above. In various embodiments, for example, the processing beam 310 may be provided as a ribbon ion beam having a long axis that extends along the X-direction of the Cartesian coordinate system shown. Thus, the substrate plane may lie parallel to the X-Y plane and the X-axis or Y-axis may lie within the substrate plane. The processing beam 310, by virtue of the scanning of the substrate 100 along the Y-direction, may non-uniformly process a silicon layer along the Y-direction by varying scan speed or by varying ion current of the processing beam 310 as a function of time during the scan.

Figure 3B:
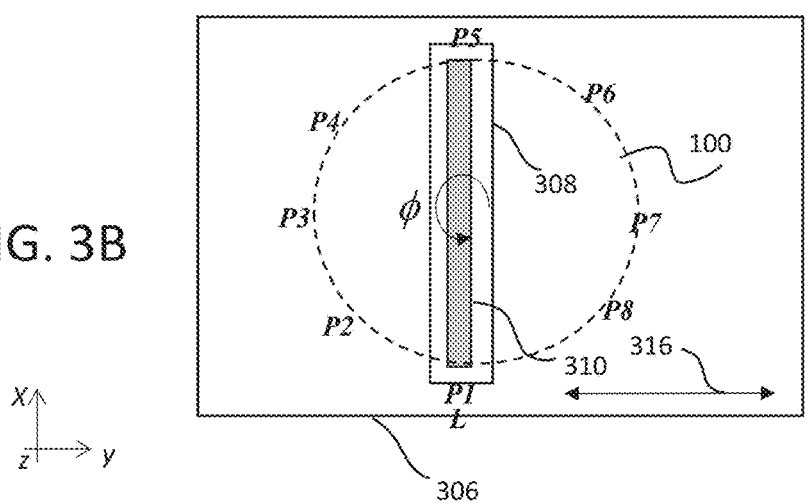
FIG. 3B depicts details of an exemplary extraction plate according to embodiments of the disclosure.

Turning now to FIG. 3B there is shown a top plan view of one variant of the exemplary operation of FIG. 3A. In this example, the substrate 100 is a circular wafer, such as a silicon wafer, the extraction aperture 308 is an elongated aperture, having an elongated shape. The processing beam 310 is provided as a ribbon ion beam extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 3B, the substrate 100 may be scanned in the scan direction 316, where the scan direction 316 lies in the X-Y plane, such as along the Y-direction. Notably, the scan direction 316 may represent the scanning of substrate 100 in two opposing (180 degrees) directions along the Y-direction, or just a scan toward the left or a scan toward the right. As shown in FIG. 3B, the long axis of processing beam 310 extends along the X-direction, perpendicularly to the scan direction 316. Accordingly, an entirety of the substrate 100 may be exposed to the processing beam 310 when scanning of the substrate 100 takes place along a scan direction 316 to an adequate length from a left side to right side of substrate 100 as shown in FIG. 3B.

As also shown in FIG. 3B, the exposure of substrate 100 to the processing beam 310 may take place when the substrate 100 is scanned while disposed at a first rotational position as indicated by the position P1 on substrate 100 being located under the location L on the extraction plate 306. For example, the position P1 may correspond to the position of a notch or a flat on a wafer. In accordance with various embodiments, a plurality of scans may be performed to process the silicon, where the substrate 100 may be rotated through a plurality of different rotational positions, as noted. For example, the position P2 may represent a position that lies on a radius of substrate 100 rotated at a given angle, such as 45 degrees with respect to the radius that intercepts the position P1. Accordingly, in the substrate 100 may be rotated with respect to a perpendicular or a perpendicular plane to the X-Y plane, through a twist angle φ of 45 degrees with respect to the rotational position of FIG. 3B. Processing of the substrate 100 in this second rotational position may proceed similarly to processing in the rotational position of FIG. 3B, where the substrate 100 is again scanned along the scan direction 316 to expose an entirety of substrate 100 to the processing beam 310 in a second scan.

In accordance with various embodiments, the process shown in FIG. 3B may be extended to a designed number of scans, where substrate 100 is rotated through a designed twist angle to a new rotational position between scans. In some examples, an SAP etch may comprise 4 exposure cycles, 6 exposure cycles, 8 exposure cycles, or more. In a particular embodiment, an SAP etch may involve 8 different exposure cycles where the substrate 100 is disposed at 8 different rotational positions, as indicated by P1, P2, P3, P4, P5, P6, P7, and P8. The 8 different rotational positions may be evenly spaced among one another in certain variants, such as spaced at rotational increments of 45 degrees. In some embodiments, the substrate 100 may be rotated in consecutive exposure cycles between adjacent rotational positions, such as from P1 to P2 to P3, and so forth. In other embodiments, in consecutive exposure cycles, other rotational sequences may be performed, such as P1 to P5 to P2 to P6 to P3 to P7 to P4 to P8. The embodiments are not limited in this context.

In various embodiments, a scan recipe for processing a silicon layer in an SOI substrate may be tailored according to a silicon thickness profile for the silicon layer 106. For example, removing or reducing a complex, two dimensional, pattern of silicon thickness variation in the silicon layer 106 may entail using a complex scan recipe, involving many scans at different twist angles, where the exposure to the processing beam is varied in a complex manner during one or more scans. Alternatively, a simple thickness non-uniformity pattern in the silicon layer 106 where silicon thickness increases monotonically from one edge to an opposite edge of substrate 100 may be addressed by performing as few as one non-uniform scan.

Returning now to FIG. 2B, in various embodiments the selective oxidation shown may be performed using the processing apparatus 300 in different modes. In one mode, a non-uniform scan of the substrate 100 may be performed to generate the selective oxidation by varying the scan speed (scan velocity) of the substrate 100 as a function of time, while the substrate 100 is exposed to processing beam 310, thus changing the dwell time of the substrate 100 under the processing beam. For example, the substrate 100 may be scanned at a more rapid speed near first position 108 and may be scanned at a less rapid speed near second position 110. In this manner, when processing beam 310 includes oxygen ions, portions of the substrate 100 near first position 108 are exposed to relatively fewer oxygen ions, becoming relatively less oxidized, and thus consuming less silicon. Portions of substrate 100 near second position 110 are exposed to relatively more oxygen ions, becoming relatively more oxidized, and thus consuming more silicon.

In another variant, during a scan of substrate 100, the plasma 304 may be provided as a pulsed plasma, such as a pulsed RF plasma, where the plasma power is pulsed from a relatively higher power to a relatively lower power. Pulsing may take place with a plasma power pulse period on the order of hundreds of Hertz or thousands of Hertz in some embodiments. The embodiments are not limited in this context. As the substrate 100 is scanned the processing apparatus 300 may vary the duty cycle of the pulsed RF plasma, meaning the ratio of the duration of a pulse at high power to the duration of the total pulse period (total pulse period=high power pulse duration plus low power interval between pulses). For example, a higher duty cycle, generating relatively more oxygen ions, may be employed when the processing beam 310 is over the second position 110, while a lower duty cycle, generating relatively fewer oxygen ions, is employed when the processing beam 310 is over first position 108.

In another embodiment, the processing beam 310 may be provided as a pulsed DC oxygen ion beam, where the DC bias is pulsed between the substrate 100 and plasma chamber 302. In order to selectively oxidize different portions of a substrate to a different amount, the DC bias duty cycle of the pulsed DC bias voltage within a DC bias pulse period may be varied during a scan in a manner analogous to the variation of duty cycle of a pulsed RF plasma, described above. The DC bias duty cycle of the pulsed DC voltage may represent the ratio of the duration of a pulse at high DC bias voltage, or any non-zero DC bias voltage, to the duration of the total pulse period. The total pulse period includes the duration of the high voltage pulse plus the duration between pulses, where the DC bias voltage between pulses may be zero DC bias voltage or a lower DC bias voltage with respect to the DC bias voltage of the pulse.

Figure 4:
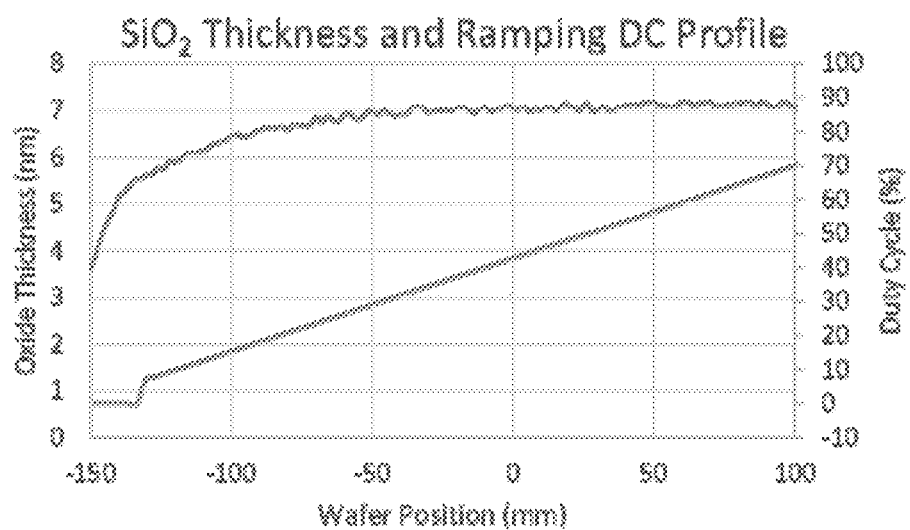
FIG. 4 presents exemplary oxygen profiles for forming an oxide layer using an ion beam according to embodiments of the disclosure.
Figure 5:
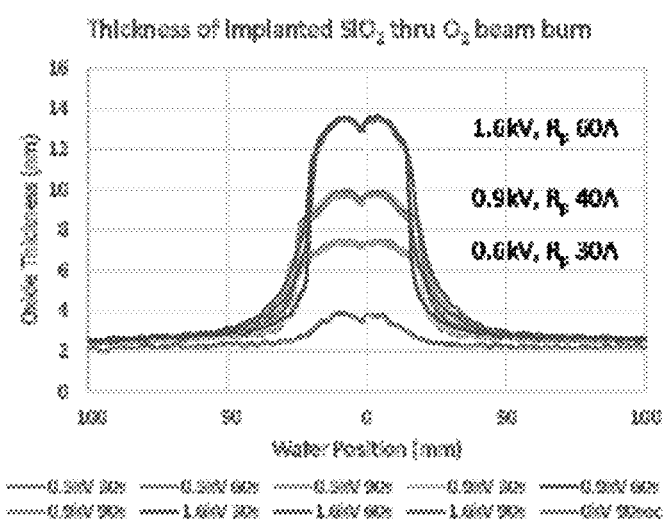
FIG. 5 presents the results of oxide thickness as a function of duty cycle of a pulsed ion beam, according to embodiments of the disclosure.

FIG. 4 depicts the results of the variation in thickness of a selectively formed oxide layer across a substrate as a function of duty cycle of a pulsed DC ion beam. As duty cycle increases up to 30% (straight line), the thickness of an oxide layer (curved) increases rapidly, while at higher duty cycles the thickness of the oxide does not vary markedly. This behavior may be used to tune the degree of oxide formation as a function of position on a substrate, especially by varying duty cycle in the range of zero to 30%. In the example of FIG. 4, at zero duty cycle the Si surface is exposed to an $O_2$ plasma, where the $O_2$ plasma may include a significant flux of reactive O* and $O^+$ that reach the surface of a substrate at the low energy (plasma potential of <50V) characteristic of when no DC extraction voltage is applied between a plasma chamber and substrate. At this temperature (~room temperature), these reactive oxygen radicals may grow, without the aid of energetic implantation, a layer of $SiO_2$ up to almost 4 nm in thickness, as shown in the zero % duty cycle plot of FIG. 4. This result is also depicted in FIG. 5, discussed below. The growth of the thin layer of $SiO_2$ is accomplished by diffusion of the Si and O through the interface. The curvature and ultimate saturation in the thickness of the oxide layer shown in FIG. 4 is due to the diffusion limits of the O and Si at this temperature. The absolute thickness limit is determined by a combination of the energy of the implant and the diffusion limit of the Si and O at this temperature.

In still other embodiments, the voltage of a pulsed DC biased oxygen ion beam may be varied as a function of position during scanning of a substrate 100, to selectively vary the thickness of an oxide layer formed in the silicon layer 106. FIG. 5 presents results showing the variation of oxide thickness for a substrate exposed to an O2 ion beam, as a function of different bias voltages, from zero to 1.6 kV. Also shown are different curves for different exposure times, from 30 seconds to 90 seconds. In the experimental conditions providing the results for FIG. 5, a silicon wafer is arranged on a stationary substrate holder adjacent an extraction aperture of a plasma chamber for varying durations. At 1.6 kV, an oxide layer of nearly 14 nm thickness may be grown, while at 0.6 kV, an oxide layer of approximately 7 nm is grown. Notably, oxide layer thickness saturates rapidly as a function of exposure time, and does not increase with increasing time between 30 seconds and 90 seconds. In accordance with the results of FIG. 5, the value of DC bias voltage of a pulsed oxygen ion beam may be varied as a function of position while the substrate 100 is scanned to selectively alter the thickness of an oxide layer at different positions in the substrate, analogous to the varying of duty cycle or scan speed, as described above.

In accordance with some embodiments of the disclosure, the results of FIGS. 4 and 5 are harnessed to tune the selective oxidation of a substrate. In one embodiment, the duration of exposure to an ion beam, such as an oxygen ion beam, for a given location on a substrate may be adjusted according to a given ion energy of the ion beam, in order to grow a given oxide thickness at the given location. In particular, the given oxide thickness may correspond to the saturation thickness for the given ion beam energy. Thus, in keeping with the results of FIG. 5, to grow a 7 nm thick oxide layer in a first location, the first ion energy may be set to 0.6 kV, and the duration may be set to at least 30 seconds. The duration of 30 seconds may represent the saturation duration for 0.6 kV ion energy (for a given ion current density), meaning that the oxide thickness on a substrate exposed to the 0.6 kV ion beam reaches 7 nm at 30 seconds and does not increase beyond 7 nm for longer exposure times beyond the saturation duration. The duration of exposure for any given location on the substrate may be accomplished by scanning the substrate with respect to an extraction aperture over one scan or multiple scans at a targeted speed to generate the saturation duration for the given location. Notably, in the results of FIG. 5, while 30 seconds is clearly sufficient duration to reach a saturation in oxide thickness, the results of FIG. 5 do not show data where the oxide thickness has an intermediate value less than 7 nm. Thus, the actual saturation duration may be substantially less than 30 seconds at 0.6 kV, for example, as little as 1 second or 0.1 second, which saturation duration may be determined empirically at the exposure duration below which exposure duration the oxide thickness begins to decrease.

To selectively grow a different thickness in a different location, the substrate may then be scanned with respect to an extraction aperture that directs the ion beam to the substrate, while the ion energy is adjusted to a different energy, such as 1.6 kV. Subsequently, a second location of the substrate may be exposed to a 1.6 kV ion beam for a duration corresponding to the saturation duration at 1.6 kV, in order to grow an oxide layer having a thickness of 14 nm. Conveniently, for each ion energy (and given ion current density), the duration of exposure to an ion beam may be set beyond the saturation duration to ensure that minor variations in exposure time do not result in changes in oxide film thickness. For example, if film thickness of an oxide film exposed to a 0.6 kV oxygen ion beam reaches 7 nm at 1 second, the duration of exposure may be set to 2 seconds to ensure that film thickness of the oxide layer does not vary if the exposure time varies by a few seconds. In this manner, oxide layers may be generated where thickness varies between different locations of the substrate, by selectively varying ion energy of the ion beam that is extracted through an extraction aperture, as the substrate is scanned between the different locations.

In additional embodiments, the thickness of an oxide layer may be selectively varied by selecting just one ion beam energy whose energy is sufficient to span the range of oxide thickness to be grown on different locations of the substrate. For example, if the target range of oxide thickness to be selectively grown on a substrate at different locations is 4 nm to 14 nm, based upon the results of FIG. 5, an oxygen ion beam energy of 1.6 kV may be selected, which energy is expected to grow an oxide layer of approximately 14 nm, at exposure durations of 30 s or more. Recall that from the data of FIG. 5, the saturation duration is no more than 30 s, and may be much less than 30 s, such as 1 s or less. Once the target ion energy is selected, the substrate may then be scanned with respect to an extraction aperture, while the duty cycle of a pulsed oxygen ion beam at 1.6 kV is varied. The duty cycle may be varied in a manner that effectively generates a total exposure duration in target location(s) of the substrate that is less than the saturation duration, so as to selectively generate an oxide thickness in the target location (s) that is less than the saturation thickness of 14 nm. For example, for a given ion current density, the saturation duration to just reach 14 nm oxide thickness at 1.6 kV ion energy may be 2 seconds, while the duration to generate 7 nm oxide thickness at 1.6 kV ion energy may be 1 second. Accordingly, to generate 14 nm oxide thickness and 7 nm oxide thickness in a first location and second location, respectively, the substrate may be scanned to expose the first location to a 1.6 kV oxygen ion beam for 2.5 seconds at 80% duty cycle, while the second location is exposed to the 1.6 kV beam for 2.5 seconds at 40% duty cycle.

In still further embodiments, any combination of the above parameters, RF plasma power duty cycle, DC pulsed bias duty cycle, scan speed, DC bias, may be varied as a function of position during a scan or during multiple different scans of a scan recipe.

Figures 6, 7:
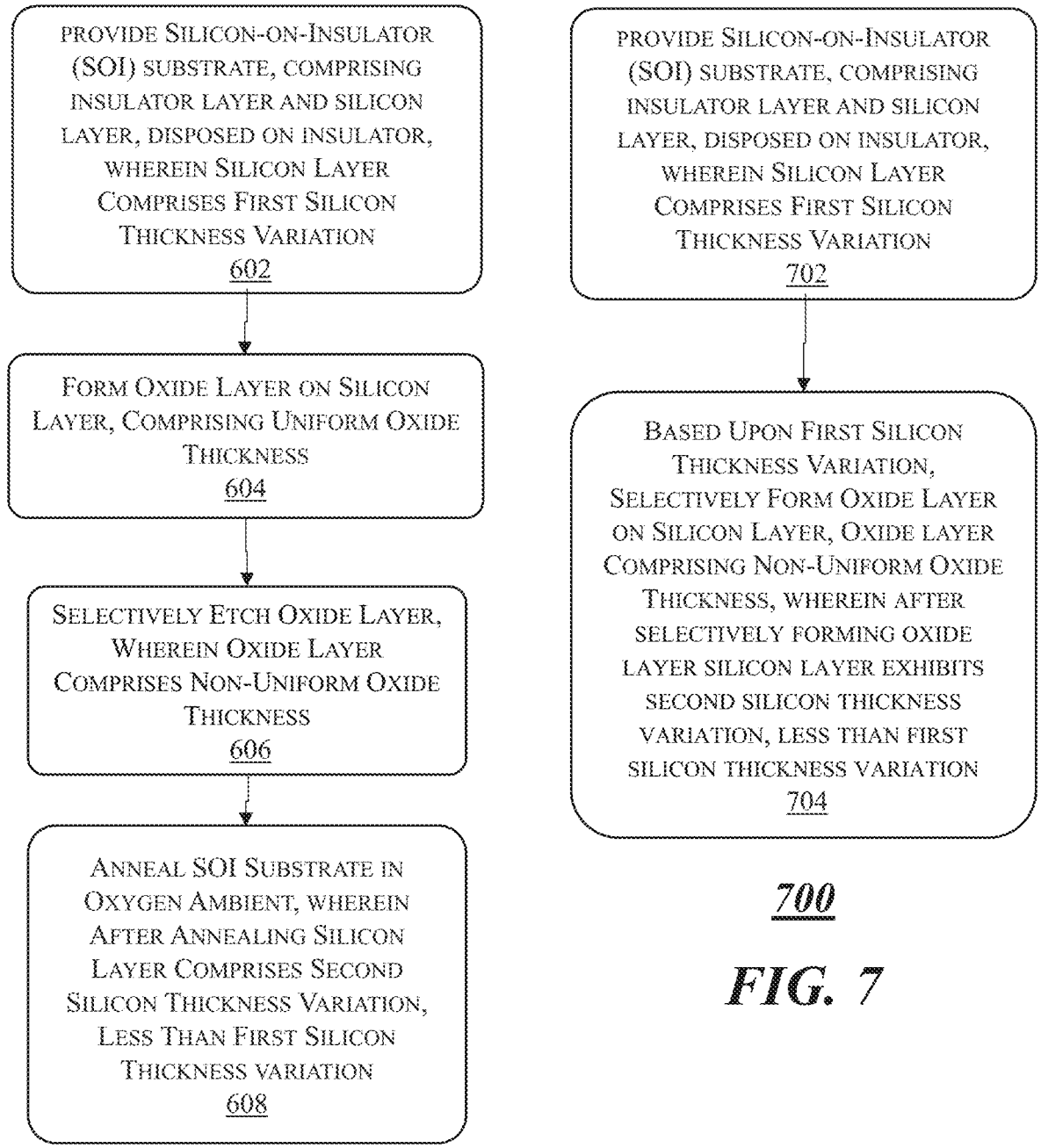
FIG. 6 presents an exemplary process flow according to an embodiment of the disclosure.
FIG. 7 depicts an exemplary process flow, according to embodiments of the disclosure.

FIG. 6 depicts an exemplary process flow 600, according to embodiments of the disclosure. At block 602, a SOI substrate is provided, comprising an insulator and silicon layer that is disposed on the insulator. The silicon layer may have a first silicon thickness variation. The first thickness variation may be characterized by a difference between a maximum silicon thickness and a minimum silicon thickness, a two dimensional thickness profile, or other metric.

At block 604 an oxide layer is formed on the silicon layer, where the oxide layer comprises a uniform oxide thickness. In some embodiments, the oxide layer may be a deposited layer, while in other embodiments the oxide layer may be formed from the silicon layer.

At block 606 the oxide layer is selectively etched, wherein the oxide layer comprises a non-uniform oxide thickness after the selective etching. In some embodiments, the selective etching may be performed using a scanned ion beam.

At block 608, the SOI substrate is annealed in an oxygen ambient, wherein after thermal processing the silicon layer comprises a second silicon thickness variation, less than the first silicon thickness variation.

In still further embodiments, any combination of the above parameters, RF plasma power duty cycle, DC pulsed bias duty cycle, scan speed, DC bias, may be varied as a function of position during a scan or during multiple different scans of a scan recipe.

FIG. 7 depicts an exemplary process flow 700, according to embodiments of the disclosure. At block 702, a SOI substrate is provided, comprising an insulator and silicon layer that is disposed on the insulator. The silicon layer may have a first silicon thickness variation. The silicon first thickness variation may be characterized by a difference between a maximum and minimum silicon thickness, a two dimensional thickness profile, or other metric.

At block 704, based upon the first silicon thickness variation, an oxide layer is selectively formed in the silicon layer, wherein the oxide layer comprises a non-uniform oxide thickness, wherein after the selectively forming the oxide layer the silicon layer exhibits a second silicon thickness variation, less than the first silicon thickness variation.

The present embodiments provide various advantages over conventional processing to define features in a substrate. For one advantage, the silicon layer in a thin SOI substrate may be processed in a manner that reduces thickness non-uniformity while not exposing the silicon layer to potentially damaging species, such as high energy sputtering ions, such as argon. Another advantage is the ability to compensate precisely for thickness non-uniformity by removing a desired amount of material using selective thermal oxidation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a silicon-on-insulator (SOI) substrate, the SOI substrate comprising:
      an insulator layer; and
      a silicon layer, the silicon layer disposed on the insulator layer, the silicon layer, the silicon layer characterized by a non-uniform thickness, comprising a first silicon thickness variation, across the SOI substrate;
   forming an oxide layer on the silicon layer across the SOI substrate, when the silicon layer has the non-uniform thickness, the oxide layer having a uniform thickness across the SOI substrate; and
   selectively etching the oxide layer on the silicon layer, wherein the oxide layer comprises a non-uniform oxide thickness, wherein
   after thermal processing of the SOI substrate in an oxygen ambient, the non-uniform oxide thickness is configured to generate a second silicon thickness variation in the silicon layer across the SOI substrate, less than the first silicon thickness variation.

2. The method of claim 1, wherein a first thickness of the oxide layer is removed at a first position of the substrate, wherein a second thickness of the oxide layer is removed at a second position of the substrate, the second thickness being greater than the first thickness, wherein, before the selectively forming the oxide layer, the silicon layer comprises a first silicon thickness at the first position, wherein the silicon layer comprises a second silicon thickness at the second position, wherein the second silicon thickness is greater than the first silicon thickness.

3. The method of claim 2, wherein the selectively etching comprises:
providing the substrate in a process chamber, adjacent a plasma chamber; extracting an ion beam from the plasma chamber into the process chamber through an extraction aperture; and
performing an etch treatment of the substrate, the etch treatment comprising performing at least one scan wherein the substrate is scanned with respect to the extraction aperture, when the substrate is exposed to the ion beam.

4. The method of claim 3, wherein the performing the at least one scan comprises:
scanning the substrate at a first velocity when the first position is exposed to the ion beam: and
scanning the substrate at a second velocity when the second position is exposed to the ion beam, the first velocity being greater than the second velocity.

5. The method of claim 3, wherein the performing the at least one scan comprises:
generating the ion beam as a pulsed ion beam;
directing the ion beam to the oxide layer at a first duty cycle at the first position; and
directing the ion beam to the oxide at a second duty cycle at the second position, the second duty cycle being greater than the first duty cycle.

6. The method of claim 3, further comprising:
receiving a silicon thickness profile before the selectively etching the oxide layer, the silicon thickness profile comprising a plurality of data sets, wherein a given data set of the plurality of data sets comprises a substrate position and a silicon layer thickness corresponding to the substrate position, and wherein the plurality of data sets includes the first position and the second position.

7. The method of claim 6, wherein the performing the selective etch comprises etching the oxide layer to match the silicon thickness profile, wherein the oxide layer is etched to a greater extent at a given position where silicon thickness is relatively greater, as compared to another given position where silicon thickness is relatively lesser.

8. The method of claim 3, wherein the extraction aperture comprises an elongated shape, wherein the ion beam comprises a ribbon beam having a beam length along a long axis of the extraction aperture, the beam length being greater than or equal to a width of the substrate, the etch treatment comprising a plurality of scans, wherein a twist angle of the substrate with respect to a perpendicular plane to a plane of the substrate is varied between successive scans of the plurality of scans.

9. The method of claim 1, wherein before the selectively etching, the oxide layer comprises an initial oxide thickness, wherein the initial oxide thickness is adjusted to compensate for the first silicon thickness variation, wherein the initial oxide thickness is greater for a greater first silicon thickness variation.

10. The method of claim 1, wherein before the forming the oxide layer, the silicon layer comprises a maximum thickness of 30 nm or less.

11. A method, comprising:
providing a silicon-on-insulator (SOI) substrate, the SOI substrate comprising:
an insulator layer: and
a silicon layer, the silicon layer disposed on the insulator layer, the silicon layer comprising by a first silicon thickness variation, across the SOI substrate; and
selectively forming an oxide layer in the silicon layer wherein the silicon layer is unmasked and is directly exposed to oxygen species across the SOI substrate,
wherein the oxide layer comprises a non-uniform oxide thickness, wherein after the selectively forming the oxide layer the silicon layer exhibits a second silicon thickness variation, across the SOI substrate, less than the first silicon thickness variation.

12. The method of claim 11, wherein a first thickness of the oxide layer is formed at a first position of the substrate, wherein a second thickness of the oxide layer is formed at a second position of the substrate, the second thickness being greater than the first thickness, wherein, before the selectively forming the oxide layer, the silicon layer comprises a first silicon thickness at the first position, wherein the silicon layer comprises a second silicon thickness at the second position, wherein the second silicon thickness is greater than the first silicon thickness.

13. The method of claim 12, wherein the selectively forming the oxide layer comprises:
providing the substrate in a process chamber, adjacent a plasma chamber;
extracting an ion beam from the plasma chamber into the process chamber through an extraction aperture, the ion beam comprising oxygen ions; and
performing at least one scan wherein the substrate is scanned with respect to the extraction aperture when the substrate is exposed to the oxygen ions.

14. The method of claim 13, wherein the performing the at least one scan comprises:
scanning the substrate at a first velocity when the first position is exposed to the ion beam: and
scanning the substrate at a second velocity when the second position is exposed to the ion beam, the first velocity being greater than the second velocity.

15. The method of claim 13, wherein the ion beam is extracted from a pulsed plasma, the pulsed plasma comprising a plasma power pulse period wherein a plasma power is pulsed from a first power level to a second power level within the plasma power pulse period, wherein the ion beam is directed to the substrate in a first plasma power duty cycle at the first position, wherein the ion beam is directed to the substrate in a second plasma power duty cycle at the second position, wherein the second plasma power duty cycle is greater than the first plasma power duty cycle.

16. The method of claim 13, wherein the ion beam is extracted using a pulsed DC bias, the pulsed DC bias comprising a DC bias pulse period wherein a DC bias is pulsed from a non-zero bias to a zero bias within the DC bias pulse period, wherein the ion beam is directed to the substrate in a first DC bias duty cycle at the first position, wherein the ion beam is directed to the substrate in a second DC bias duty cycle at the second position, wherein the second DC bias duty cycle is greater than the first DC bias duty cycle.

17. The method of claim 13, wherein the ion beam is extracted using a pulsed DC bias voltage, the pulsed DC bias voltage varying from a first bias voltage when the ion beam is directed to the substrate at the first position, to a second bias voltage when the ion beam is directed to the substrate at the second position, wherein the second bias voltage is greater than the first bias voltage.

18. The method of claim 13, wherein the extraction aperture comprises an elongated shape, wherein the ion beam comprises a ribbon beam having a beam length along a long axis of the extraction aperture, the beam length being greater than or equal to a width of the substrate, the at least one scan comprising a plurality of scans, wherein a twist angle of the substrate with respect to a perpendicular plane to a plane of the substrate is varied between successive scans of the plurality of scans.

19. The method of claim 11, wherein before the selectively forming the oxide layer, the silicon layer comprises a maximum thickness of 30 nm or less.

\* \* \* \* \*